US012666968B2

(12) United States Patent
Lin et al.

(10) Patent No.: US 12,666,968 B2
(45) Date of Patent: Jun. 23, 2026

(54) SEMICONDUCTOR DEVICE AND METHOD FORMING SAME

(71) Applicant: Taiwan Semiconductor Manufacturing Co., Ltd., Hsinchu (TW)

(72) Inventors: Wen-Yi Lin, New Taipei City (TW); Kuang-Chun Lee, New Taipei City (TW); Chien-Chen Li, Hsinchu (TW); Chien-Li Kuo, Hsinchu (TW); Kuo-Chio Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 600 days.

(21) Appl. No.: 17/841,275

(22) Filed: Jun. 15, 2022

(65) Prior Publication Data

US 2023/0411307 A1     Dec. 21, 2023

(51) Int. Cl.
H10W 42/00 (2026.01)
H05K 1/02 (2006.01)
H05K 3/28 (2006.01)
H10W 70/05 (2026.01)
H10W 72/00 (2026.01)
(Continued)

(52) U.S. Cl.
CPC ....... H10W 42/121 (2026.01); H10W 74/012 (2026.01); H10W 74/15 (2026.01); H05K 1/0271 (2013.01); H05K 3/287 (2013.01); H10W 70/093 (2026.01); H10W 72/07202 (2026.01); H10W 72/983 (2026.01)

(58) Field of Classification Search
CPC ................. H01L 21/563; H01L 23/562; H01L 2224/81007; H01L 2224/82007; H01L 2224/02235; H01L 2224/27013; H01L 2924/18301; H05K 1/0271; H05K 3/287; H10W 42/121; H10W 74/012
See application file for complete search history.

(56) References Cited

U.S. PATENT DOCUMENTS 5,186,383 A * 2/1993 Melton ................ B23K 1/0016
                                                    257/E21.511
5,700,715 A * 12/1997 Pasch ................ H01L 23/53285
                                                    257/E21.511
(Continued)

OTHER PUBLICATIONS

Lai, P. et al., U.S. Appl. No. 17/346,972, entitled, "Semiconductor Devices and Methods of Manufacturing,", filed Jun. 14, 2021.

*Primary Examiner* — David A Zarneke
(74) *Attorney, Agent, or Firm* — Slater Matsil, LLP

(57) ABSTRACT

Package structures and methods of forming package structures are discussed. A package structure, in accordance with some embodiments, includes a large package component, such as a CoWoS, adhered to a large package substrate, such as a printed circuit board, an underfill material disposed between the large package component and the large package substrate, and a stress-release structure with high elongation values formed from photolithography encapsulated by the underfill material. The stress-release structure helping to reduce stress in the underfill material to reduce the risk of underfill cracking caused by the difference in coefficients of thermal expansion between the large package component and the large package substrate.

20 Claims, 17 Drawing Sheets

(51) Int. Cl.

| | | |
|---|---|---|
| *H10W 72/90* | (2026.01) | |
| *H10W 74/01* | (2026.01) | |
| *H10W 74/15* | (2026.01) | |

(56) References Cited

U.S. PATENT DOCUMENTS

| 6,270,588 B1 * | 8/2001 | Takano ................. G01R 33/09 |
| | | 148/108 |
| 6,324,069 B1 * | 11/2001 | Weber ................... H01L 21/565 |
| | | 29/841 |
| 6,750,552 B1 * | 6/2004 | Narayanan ........... H01L 21/563 |
| | | 257/E23.101 |
| 7,615,872 B2 * | 11/2009 | Takahashi ......... H01L 23/49838 |
| | | 438/114 |
| 7,737,563 B2 * | 6/2010 | Su ........................ H01L 23/585 |
| | | 438/126 |

| 8,217,514 B2 * | 7/2012 | Pendse ................... H01L 24/32 |
| | | 257/737 |
| 9,153,550 B2 * | 10/2015 | Lin ....................... H01L 23/562 |
| 10,096,540 B2 * | 10/2018 | Lee ........................ H01L 24/81 |
| 10,157,888 B1 * | 12/2018 | Lin ..................... H01L 21/6835 |
| 10,515,865 B2 | 12/2019 | Chen et al. |
| 10,825,799 B2 * | 11/2020 | Shih ........................ H01L 25/50 |
| 11,545,455 B2 * | 1/2023 | Hsu ........................ H01L 24/26 |
| 11,990,408 B2 * | 5/2024 | Wagner ................. H01L 23/585 |
| 12,218,092 B2 * | 2/2025 | Jang ........................ H01L 23/13 |
| 2005/0221534 A1 * | 10/2005 | Suh ...................... H05K 3/3436 |
| | | 438/109 |
| 2007/0152347 A1 * | 7/2007 | Hori ....................... H01L 24/81 |
| | | 257/E23.179 |
| 2008/0203564 A1 * | 8/2008 | Motoyoshi ............. H01L 24/83 |
| | | 438/117 |
| 2020/0381383 A1 * | 12/2020 | Hsu ..................... H01L 21/4846 |
| 2022/0352109 A1 * | 11/2022 | Yu ........................... H01L 24/16 |
| 2024/0162195 A1 * | 5/2024 | Park ................... H01L 25/0657 |

* cited by examiner

SEMICONDUCTOR DEVICE AND METHOD FORMING SAME

BACKGROUND

Integrated circuit packages may have a plurality of package components such as device dies and package substrates bonded together to increase the functionality and integration level. Due to the differences between different materials of the plurality of package components, cracking can occur. With the increase in the size of the packages, cracking can become more severe. This incurs some new problems which should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
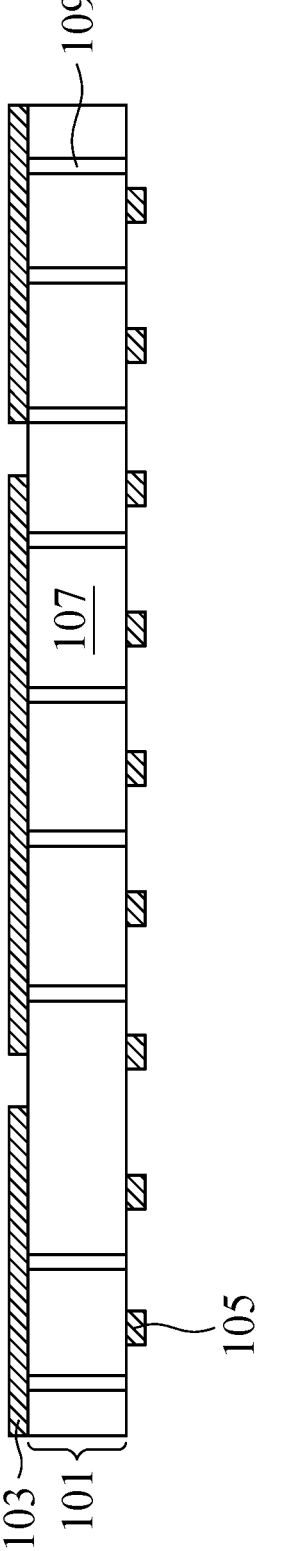
FIGS. 1-9 illustrate the cross-sectional views of intermediate stages in the formation of a large substrate component, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and method of forming the same are provided as embodiments of the ideas presented herein. In accordance with some embodiments an intermediate semiconductor device is illustrated for the purpose of discussion. In accordance with some embodiments of the present disclosure, a stress-releasing structure is built that helps to reduce the risk of cracks forming within the underfill. Embodiments discussed herein are to provide examples to enable making or using the subject matter of this disclosure. Although method embodiments may be discussed as being performed in a particular order, other method embodiments may be performed in any order.

With respect now to FIG. 1, this figure illustrates a core substrate 101 comprising an upper side with first redistribution structures 103 and a bottom side with second redistribution structures 105. Before attaching the first redistribution structures 103 and the second redistribution structures 105 to the core substrate 101 the core substrate 101 may be provided or manufactured according to applicable manufacturing processes to contain various redistribution structures.

In an embodiment the core substrate 101 includes a core 107. The core 107 may be formed of one or more layers of glass fiber, resin, filler, pre-preg, epoxy, silica filler, ABF, polyimide, molding compound, other materials, and/or combinations thereof. In some embodiments, for example, two layers of material make up the core 107. The core 107 may be formed of organic and/or inorganic materials. In some embodiments, the core 107 includes one or more passive components (not shown) embedded inside. The core 107 may comprise other materials or components.

Conductive vias 109 are formed extending through the core 107. The conductive vias 109 comprise a conductive material such as copper, a copper alloy, or other conductors, and may include a barrier layer (not shown), liner (not shown), seed layer (not shown), and/or a fill material, in some embodiments. The conductive vias 109 provide vertical electrical connections from one side of the core 107 to the other side of the core 107. For example, some of the conductive vias 109 are coupled between conductive features at one side of the core 107 and conductive features at an opposite side of the core 107. Holes for the conductive vias 109 may be formed using a drilling process, photolithography, a laser process, or other methods, as examples, and the holes of the conductive vias 109 are then filled or plated with conductive material. In some embodiments, the conductive vias 109 are hollow conductive through vias having centers that are filled with an insulating material.

The core substrate 101 may include active and passive devices (not shown), or may be free from either active devices, passive devices, or both. A wide variety of devices such as transistors, capacitors, resistors, combinations of these, and the like may be used. The devices may be formed using any suitable methods.

Further illustrated in FIG. 1, is a formation of the first redistribution structures 103 on the upper side of the core substrate 101 and a formation of the second redistribution structures 105. The first redistribution structures 103 are electrically coupled through the core substrate 101 to the second redistribution structures 105 by the conductive vias 109.

As an example of the formation of the first redistribution structures 103, a seed layer (not shown) is formed over the upper side of the core substrate 101. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist (also not shown) is then formed and patterned on the seed layer. The photoresist may be formed by spin coating or the like and may be exposed to light for patterning. The patterning and a subsequent developing forms openings through the photoresist to expose the seed layer, where the openings in the photoresist correspond to the first redistribution structures 103. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the first redistribution structures 103. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Once the first redistribution structures 103 have been formed the second redistribution structures 105 may be formed. The second redistribution structures 105 may be formed in a similar manner as the first redistribution structures 103 but occurring on the bottom side of the core substrate 101. It should be understood that the formation of the second redistribution structures 105 does not need to occur after the formation of the first redistribution structures 103 and may occur prior to the formation of the first redistribution structures 103. For illustrative purposes individual process steps that occur on the upper side of the core substrate 101 and that occur on the bottom side of the core substrate 101 may be illustrated in the same figure but should be noted that these processes may be carried out in any order applicable to form the embodiments discussed herein. Further, it should be noted that the location of the first redistribution structures 103 and the location of the second redistribution structures 105 with respect to the location of conductive vias 109 is for illustrative purposes only, as any suitable locations, and any suitable connections between the first redistribution structures 103, the second redistribution structures 105, and the conductive vias 109 may be used.

Figure 2:
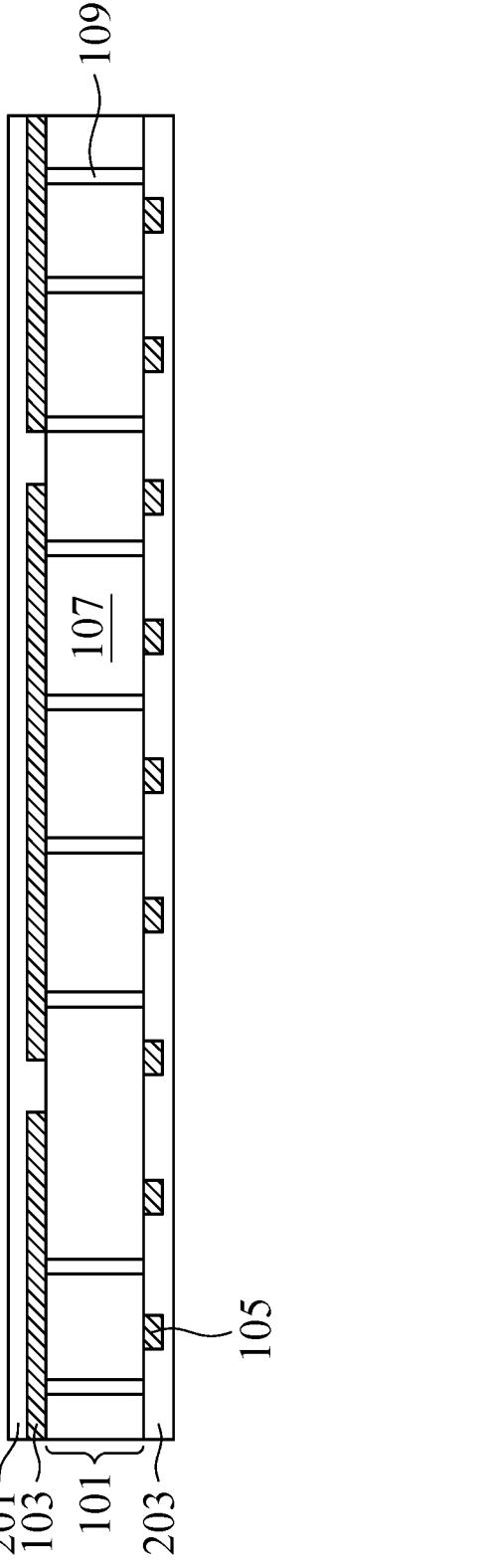

FIG. 2 illustrates a placement of a first layer 201 over the first redistribution structures 103 and the placement of a second layer 203 over the second redistribution structures 105. The first layer 201 or second layer 203 may act or be a resist layer, a solder resist layer, a photoresist, a mask layer, and/or a passivation layer. In some embodiments the first layer 201 and the second layer 203 may be a material such as polyimide, a polybenzoxazole (PBO), an epoxy, bismaleimide triazine (BT), poly(p-phenylene oxide), combinations of these, or the like. However, any suitable material may be used. In some embodiments the first layer 201 may be formed of the same material as the second layer 203. In another embodiment the first layer 201 may not be formed of the same material as the second layer 203.

In an embodiment in which the first layer 201 is a polyimide material, the first layer 201 may be formed by initially generating a polyimide solution, which may comprise a polyimide resin along with photoactive components (PACs) placed into a polyimide solvent. The PACs may be photoactive components such as photoacid generators, photobase generators, free-radical generators, or the like, and the PACs may be positive-acting or negative-acting. However any suitable photosensitive resin may be used. The polyimide solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

In an embodiment the polyimide resin and the PACs, along with any desired additives or other agents, are added to the polyimide solvent to form a polyimide solution. The polyimide solution is then mixed in order to achieve an even composition throughout the polyimide solution in order to ensure that there are no defects caused by an uneven mixing or non-constant composition.

The first layer 201 may be formed by initially applying the polyimide solution over the first redistribution structures 103 and the upper side of the core substrate 101 so that the polyimide solution may coat exposed surfaces of the first redistribution structures 103 and exposed surfaces of the upper side of the core substrate 101. In an embodiment the polyimide solution may be applied using a process such as a spin-on coating process, a dip coating method, an air-knife coating method, a curtain coating method, a wire-bar coating method, a gravure coating method, a lamination method, an extrusion coating method, combinations of these, or the like.

Once applied, the first layer 201 may be pre-baked in order to dry the first layer 201 prior to exposure (described further below). The curing and drying of the first layer 201 removes the solvent components while leaving behind the resin, the PACs, and any other chosen additives. In an embodiment the pre-bake may be performed at a temperature suitable to evaporate the solvent, such as between about 40° C. and 150° C., although the precise temperature depends upon the materials chosen for the first layer 201. The pre-bake is performed for a time sufficient to cure and dry the first layer 201, such as between about 10 seconds to about 5 minutes.

In an embodiment the process for forming the polyimide solution utilized in forming the first layer 201 may be the same as the process for forming the polyimide solution utilized in forming the second layer 203. Further, the application process of the polyimide solution to form the second layer 203 may be the same as the application process discussed above with respect to the applying the polyimide solution, pre-baking the polyimide solution to form the second layer 203 but occurring on the bottom side of the core substrate 101. The formation of the first layer 201 may be carried out prior to the formation of the second layer 203 or after the formation of the second layer 203.

Figure 3:
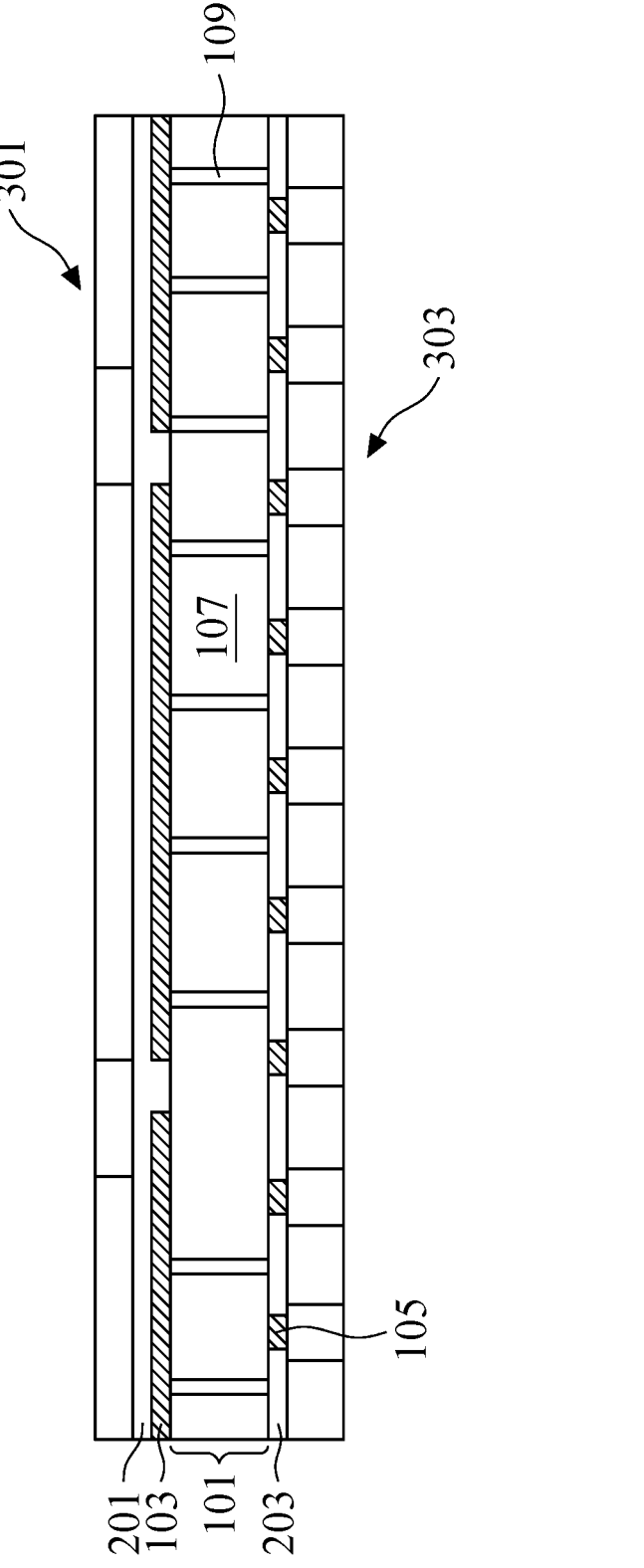

FIG. 3 illustrates a process step in patterning the first layer 201 and patterning the second layer 203. The first layer 201, once dried, may be patterned in order to form first openings 401 (depicted in FIG. 4) to expose portions of the first redistribution structures 103. In an embodiment the patterning may be initiated by placing the intermediate semiconductor device into an imaging device (not illustrated) for exposure. The imaging device may comprise a support plate (not illustrated), an energy source (not illustrated) that emits an energy (e.g. light), and a first patterned mask 301 between the support plate and the energy source.

The first patterned mask 301, while illustrated in FIG. 3 as being directly adjacent to the first layer 201, is located somewhere between the energy source and the first layer 201 in order to block portions of the energy to form a patterned energy prior to the energy actually impinging upon the first layer 201. In an embodiment the patterned mask may comprise a series of layers (e.g., substrate, absorbance layers, anti-reflective coating layers, shielding layers, etc.) to reflect, absorb, or otherwise block portions of the energy from reaching those portions of the first layer 201 which are not desired to be illuminated. The desired pattern may be formed in the first patterned mask 301 by forming openings through the first patterned mask 301 in a desired shape of exposure.

In an embodiment once the first patterned mask 301 has been aligned for permitting the desired shape of exposure to the first layer 201, the energy source generates the desired energy (e.g., light) which passes through the first patterned mask 301 to the first layer 201. In an embodiment the energy exposed to portions of the first layer 201 induce a reaction of the PACs, which in turn reacts with the resin to chemically alter those portions of the first layer 201 to which the energy impinges. In some embodiments the chemical alteration includes a cross-linking between separate polymers of the polymer resin.

After the first layer 201 has been exposed, a first post-exposure bake may be used in order to assist in the generating, dispersing, and reacting of the acid/base/free radical generated from the impingement of the energy upon the PACs during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In an embodiment the temperature of the first layer 201 may be increased to between about 70° C. to about 150° C., for a period of between about 40 seconds to about 120 seconds. However, any suitable temperature and time may be utilized.

Once the first layer 201 has been exposed and potentially post exposure baked, the first layer 201 may be developed with the use of a first developer. In an embodiment in which the first layer 201 is polyimide, the first developer may be an organic solvent or a fluid utilized to remove those portions of the first layer 201 which were not exposed to the energy and, as such, retain their original solubility.

The first developer may be applied to the first layer 201 using, e.g., a spin-on process. In this process the first developer is applied to the first layer 201 from above the first layer 201 while the first layer 201 is rotated. In an embodiment the first developer may be at a temperature of between about 10° C. and about 80° C., and the development may continue for between about 1 minute to about 60 minutes. While the spin-on method described herein is one suitable method for developing the first layer 201 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

In an embodiment, once the first layer 201 has been developed, the first layer 201 may be rinsed. In an embodiment the first layer 201 may be rinsed with a rinsing liquid such as propylene glycol monomethyl ether acetate (C260), although any suitable rinse solution, such as water, may be used.

In an embodiment, after development a post development baking process may be utilized in order to help polymerize and stabilize the first layer 201 after the development process. In an embodiment the post-developing baking process may be performed at a temperature of between about 80° C. and about 200° C., for a time of between about 60 sec to about 300 sec.

In an embodiment, after development the first layer 201 may be cured. In an embodiment in which the first layer 201 comprises a polyimide, the curing process may be performed at a temperature of less than about 230° C., such as a temperature of between about 200° C. and 230° C., for a time of between about 1 hour and about 2 hours. However, any suitable temperature and time may be utilized.

The patterning of the second layer 203 may occur following a similar process as that discussed above with respect to the patterning of the first layer 201 while utilizing the first bottom side patterned mask 303 to achieve the desired shape of exposure to pattern the second layer 203. The formation and alignment of the first bottom side patterned mask 303 may be different from that of the first patterned mask 301 so that the patterning of the second layer 203 may be different from the patterning of the first layer 201. The patterning of the second layer 203 forms second openings 403 (depicted in FIG. 4). It should be noted that the steps taken to pattern the second layer 203 may be taken in any appropriate sequence in conjunction with the steps taken to pattern the first layer 201.

It should be noted, that, while using a photosensitive material (e.g., a photosensitive polyimide) is described above, this is intended to be illustrative and is not intended to limiting to the embodiments, as any suitable method may be utilized. For example, in other embodiments, the patterning of the first layer 201 and the second layer 203 may be conducted through the use of a photoresist, wherein a photoresist can be formed by using a spin-on technique and can be patterned using acceptable photolithography techniques. Once patterned, etching techniques may then by utilized to form the first openings 401 and the second openings 403. The photoresist may then be removed by a suitable process, such as by an ashing process.

Figure 4:
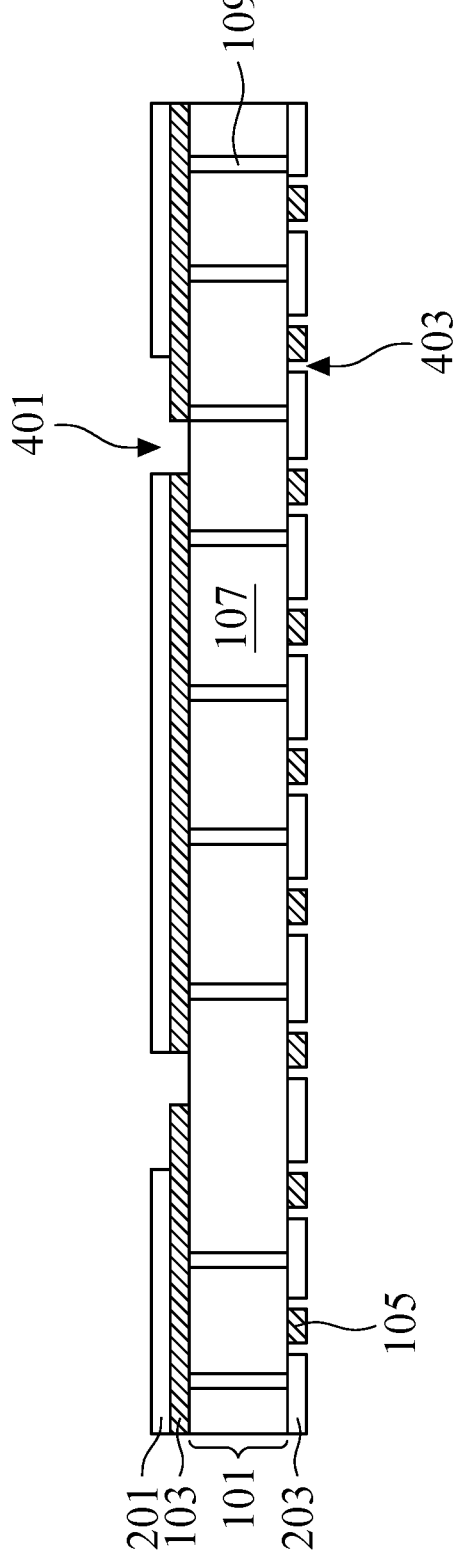

FIG. 4 illustrates the intermediate semiconductor device following the patterning of the first layer 201 and the patterning of the second layer 203 (and removal of the first bottom side patterned mask 303). FIG. 4 further illustrates that following the patterning of the first layer 201 the first openings 401 are present in the first layer 201. The first openings 401 exposes portions of the first redistribution structures 103 as well as portions of the upper side of the core substrate 101. In addition, following the patterning of the second layer 203 the second openings 403 are present in the second layer 203. The second openings 403 exposes portions of the second redistribution structures 105 as well as portions of the bottom side of the core substrate 101.

Figure 5:
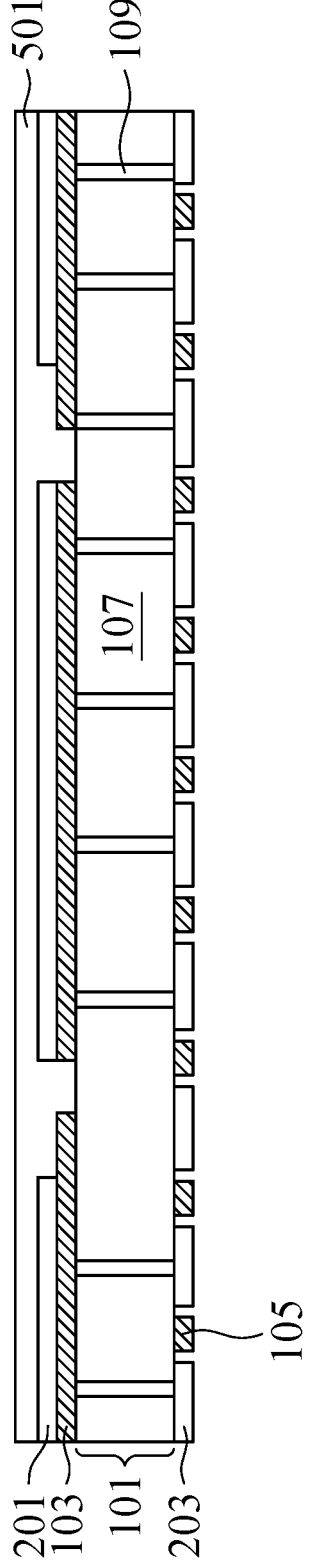

FIG. 5 illustrates a placement of a third layer 501 over the exposed portions of the upper side of the core substrate 101, the exposed portions of the first redistribution structures 103 and the first layer 201. The third layer 501 may be a resist layer, a solder resist layer, a photoresist layer, a mask layer and/or a passivation layer. In an embodiment the third layer 501 may comprise a material which will not significantly shrink during subsequent processes and which will also have a high transmittance during subsequent exposure processes (e.g., photolithographic exposures). In an embodiment the third layer 501 may be a material such as polyimide, a polybenzoxazole (PBO), an epoxy, bismaleimide triazine (BT), poly(p-phenylene oxide), combinations of these, or the like. However, any suitable material may be used. In some embodiments the third layer 501 may be formed of the same material as the first layer 201. In another embodiment the third layer 501 may not be formed of the same material as the first layer 201.

In an embodiment in which the third layer 501 is a polyimide material, the third layer 501 may be formed in a similar manner as the polyimide material discussed with respect to the first layer 201. The third layer 501 may be formed by initially applying the polyimide solution over the first layer 201 so that the polyimide solution may coat exposed surfaces the first layer 201, exposed surfaces of the first redistribution structures 103 and exposed surfaces of the upper side of the core substrate 101. In an embodiment the polyimide solution may be applied using a process such as a spin-on coating process, a dip coating method, an air-knife coating method, a curtain coating method, a wire-bar coating method, a gravure coating method, a lamination method, an extrusion coating method, combinations of these, or the like.

Once applied, the third layer 501 may be pre-baked in order to cure and dry the third layer 501 prior to exposure (in a similar manner as discussed above with respect to the first layer 201). The curing and drying of the third layer 501 removes the solvent components while leaving behind the resin, the PACs, and any other chosen additives. In an embodiment the pre-bake may be performed at a temperature suitable to evaporate the solvent, such as between about 40° C. and 150° C., although the precise temperature depends upon the materials chosen for the third layer 501. The pre-bake is performed for a time sufficient to cure and dry the third layer 501, such as between about 10 seconds to about 5 minutes.

Figure 6:
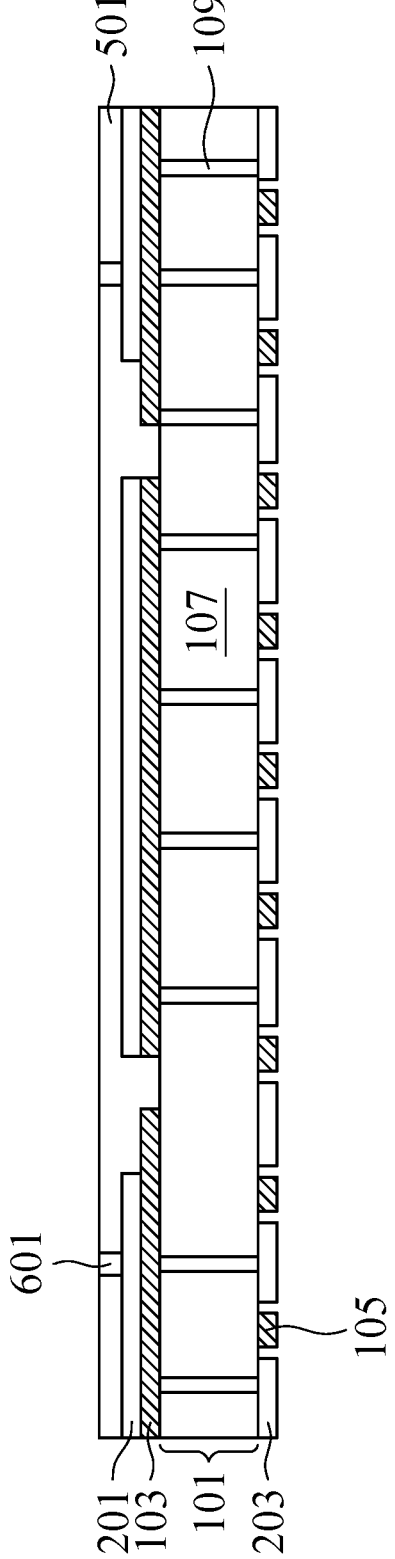

FIG. 6 illustrates the third layer 501 after alteration in preparation of forming first blocks 601. The first blocks 601 may be stress-release-blocks. In an embodiment the patterning to form the first blocks 601 may be initiated by placing the intermediate semiconductor device into an imaging device (not illustrated) for exposure in a similar manner as discussed above with respect to patterning the first layer 201. In an embodiment, a second upper side patterned mask (not illustrated) may be aligned for permitting the desired shape of exposure to the third layer 501, the energy source generates the desired energy (e.g., light) which passes through the second upper side patterned mask to the third layer 501. In an embodiment the energy exposed to portions of the third layer 501 induce a reaction of the PACs, which in turn reacts with the resin to chemically alter those portions of the third layer 501 to which the energy impinges. In some embodiments the chemical alteration includes a cross-linking between separate polymers of the polymer resin.

After the third layer 501 has been exposed, a second post-exposure bake may be used in order to assist in the generating, dispersing, and reacting of the acid/base/free radical generated from the impingement of the energy upon the PACs during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In an embodiment the temperature of the third layer 501 may be increased to between about ° C. to about 150° C., for a period of between about 40 seconds to about 120 seconds. However, any suitable temperature and time may be utilized.

Figure 7:
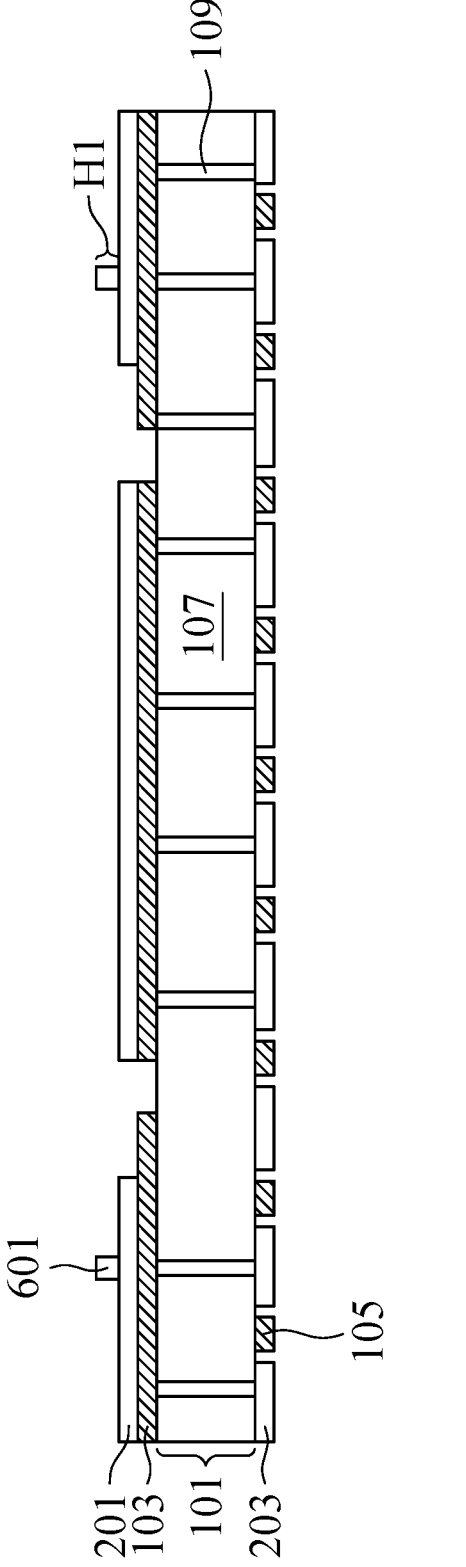

FIG. 7 illustrates once the third layer 501 has been exposed and potentially post exposure baked, the third layer 501 may be developed with the use of a second developer in order to form the first blocks 601. In an embodiment in which the third layer 501 is the polyimide, the second developer may be an organic solvent or a fluid utilized to remove those portions of the third layer 501 which were not exposed to the energy and, as such, retain their original solubility.

The second developer may be applied to the third layer 501 using, e.g., a spin-on process. In this process the second developer is applied to the third layer 501 from above the third layer 501 while the third layer 501 is rotated. In an embodiment the second developer may be at a temperature of between about 10° C. and about 80° C., and the development may continue for between about 1 minute to about 60 minutes. While the spin-on method described herein is one suitable method for developing the third layer 501 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

In an embodiment, once the third layer 501 has been developed, the third layer 501 may be rinsed. In an embodiment the third layer 501 may be rinsed with a rinsing liquid such as propylene glycol monomethyl ether acetate (C260), although any suitable rinse solution, such as water, may be used.

In an embodiment, after development a second post-developing baking process may be utilized in order to help polymerize and stabilize the third layer 501 after the development process. In an embodiment the second post-developing baking process may be performed at a temperature of between about 80° C. and about 200° C., for a time of between about 60 sec to about 300 sec.

In an embodiment, after development the third layer 501 may be cured. In an embodiment in which the third layer 501 comprises a polyimide, the curing process may be performed at a temperature of less than about 230° C., such as a temperature of between about 200° C. and 230° C., for a time of between about 1 hour and about 2 hours. However, any suitable temperature and time may be utilized.

FIG. 7 further illustrates first blocks 601 as an isolated structure built up on the first layer 201 with desired dimensions and properties following the patterning, the development, and the curing of the third layer 501. In an embodiment, the first blocks 601 have a length L1 (depicted in FIG. 12B) that ranges from about 10 microns to about 1,000 microns, and a width W1 (depicted in FIG. 12B) that ranges from about microns to about 1,000 microns, and a first height H1 that ranges from about 10 microns to about 70 microns, for a total volume that ranges from about 1,000 cubic microns to about 70,000,000 cubic microns. The process steps discussed above as applied to the material of the third layer 501 may result in the first blocks 601 having the following material properties. The first blocks 601 may have an elongation value that ranges from about 5% to about 10%, a low modulus value that ranges from about 1 GPa to about 6 GPa, a fracture toughness that ranges from about 2 MPa*m^($\frac{1}{2}$) to about 8 MPa*m^($\frac{1}{2}$), and a thermal decomposition temperature greater than 300° C.

Figure 8:
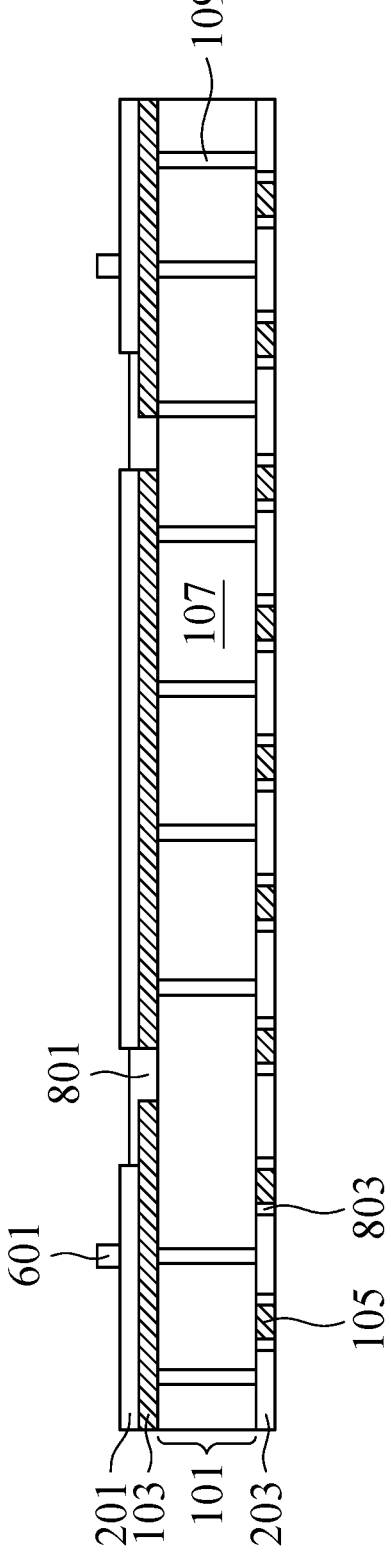

FIG. 8 illustrates a formation of first contact pads 801 and a formation of second contact pads 803. The first contact pads 801 may be formed by plating, such as electroplating or electroless plating, or the like. The plating of the first contact pads 801 occurs on the exposed portions of the first redistribution structures 103 and on the exposed surfaces of the upper side of the core substrate 101. The first contact pads 801 may comprise a metal, e.g., gold, nickel, copper, or the like.

The second contact pads 803 may be formed by plating, such as electroplating or electroless plating, or the like. The plating of the second contact pads 803 occurs on the exposed portions of the second redistribution structures 105 and on the exposed surfaces of the bottom side of the core substrate 101. The second contact pads 803 may comprise a metal, e.g., gold, nickel, copper, or the like.

Figure 9:
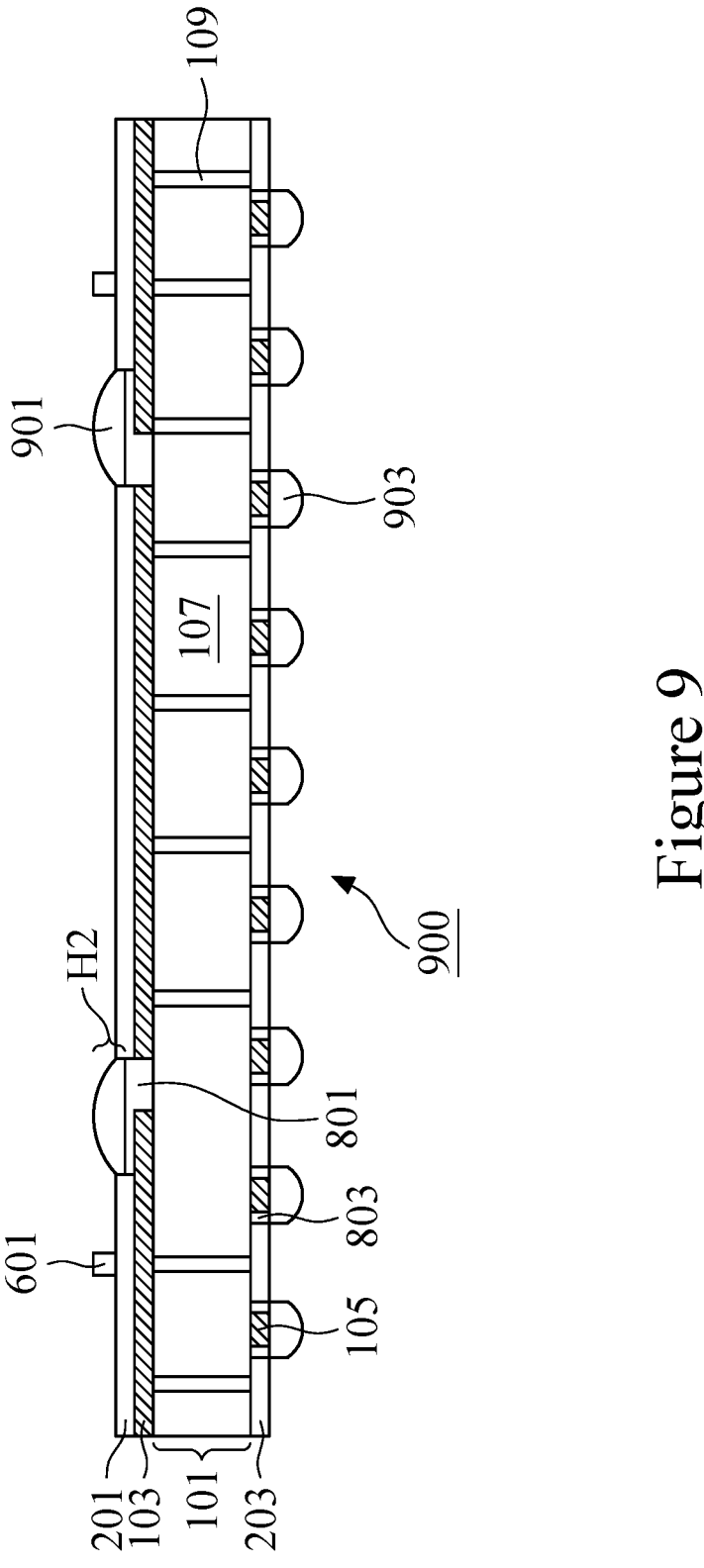

FIG. 9 illustrates a formation of first external connectors 901 and a formation of second external connectors 903 forming a package substrate 900. The first external connectors 901 are formed over the first contact pads 801. In an embodiment, the first external connectors 901 may be contact bumps such as microbumps and may comprise a material such as tin, or other suitable materials, such as silver or copper. In an embodiment in which the first external connectors 901 are tin solder bumps, the first external connectors 901 may be formed by initially forming a layer of tin through any suitable method such as evaporation, electroplating, printing, solder transfer, ball placement. Once a layer of tin has been formed on the structure, a reflow is performed in order to shape the material into the desired bump shape. However, any suitable type of external contacts, such as controlled collapse chip connection (C4) bumps, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may be utilized for the first external connectors 901. Any suitable external connector, and any suitable process for forming the first external connectors 901, may be utilized, and all such external connectors are fully intended to be included within the scope of the embodiments.

In an embodiment, the first external connectors 901 have a second height H2, the second height (i.e. bump height) H2 that ranges between about 40 microns and about 70 microns. In an embodiment the second height H2 is at least twice the first height H1 of the first blocks 601. However, any suitable dimensions may be utilized.

In an embodiment, the second external connectors 903 may be formed in a similar manner as the first external connectors 901. The second external connectors 903 may also be formed from the same material as the first external connectors 901. Further, the second external connectors 903 are formed on the second contact pads 803.

Figure 10:
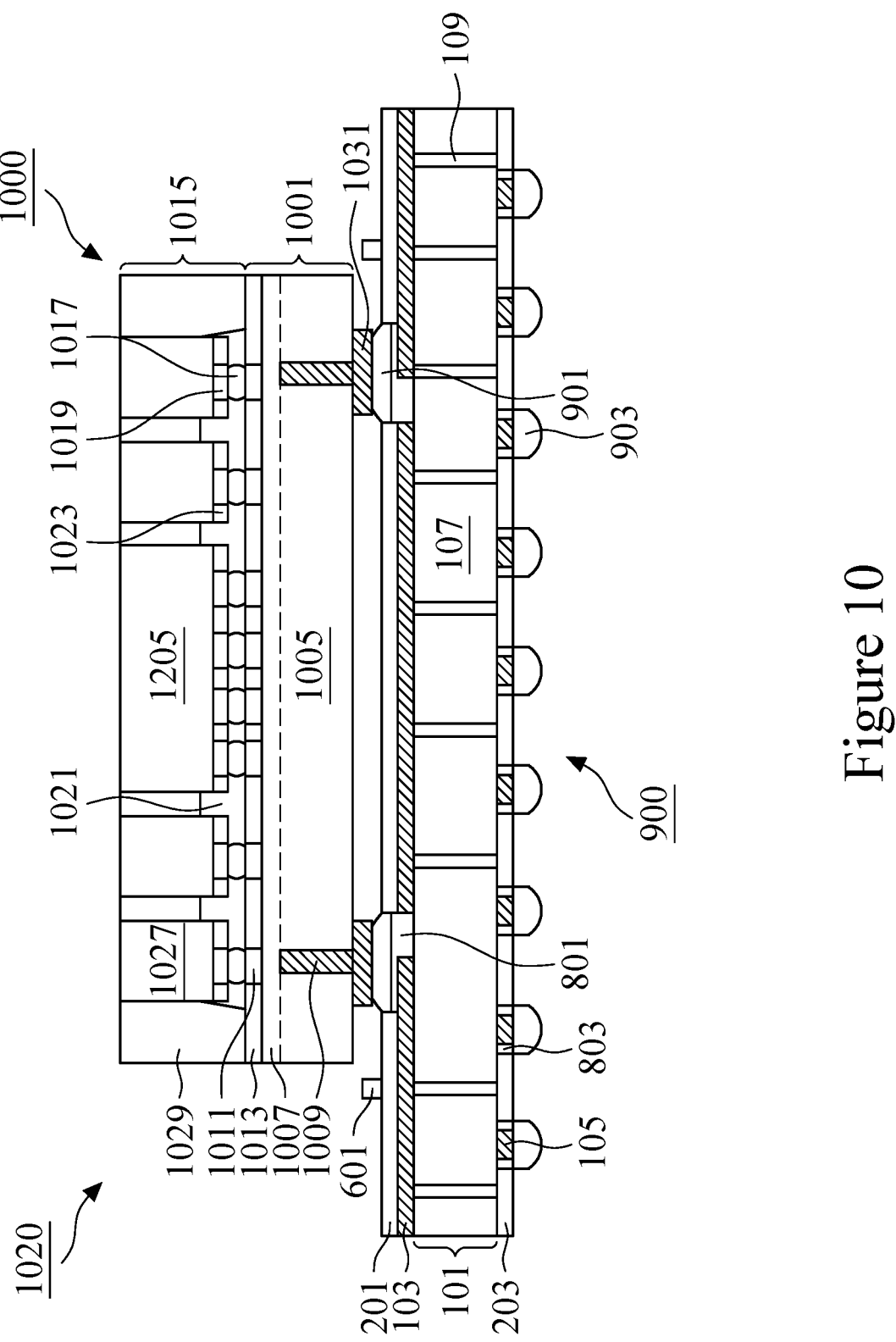
FIGS. 10, 11, and 12A-B illustrate the cross-sectional views and a top-down view of intermediate stages in the formation of a large semiconductor package attached to a large substrate component containing a stress-releasing structure in an underfill material disposed between the large semiconductor package and the large substrate component.

FIG. 10 illustrates the mounting of a first package component 1000 onto the first external connectors 901. In an embodiment the first package component 1000 may be a chip-on-wafer (CoW) package component. In an embodiment, an interposer component 1001 of the first package component 1000 may comprise a package component substrate 1005, a package component redistribution or metallization layer 1007, package component conductive vias 1009, package component first die connectors 1011, and a package component first dielectric layer 1013. In an embodiment, a chip component 1015 of the first package component 1000 may comprise package component first conductive connectors 1017, package component second die connectors 1019, a package component underfill 1021, a package component second dielectric layer 1023, a package component first integrated circuit die 1025, package component second integrated circuit dies 1027, and a package component encapsulant 1029.

The first package component 1000 has under-bump metallizations (UBM) 1031 which may be attached to the package component conductive vias 1009. The UBMs 1031 of the first package component 1000 are aligned with the first external connectors 901. In an embodiment, the first external connectors 901 may be reflowed to bond with the UBMs 1031 of the first package component 1000 attaching the first package component 1000 to the package substrate 900 forming a chip-on-wafer-on-substrate (CoWoS) 1020.

Figure 11:
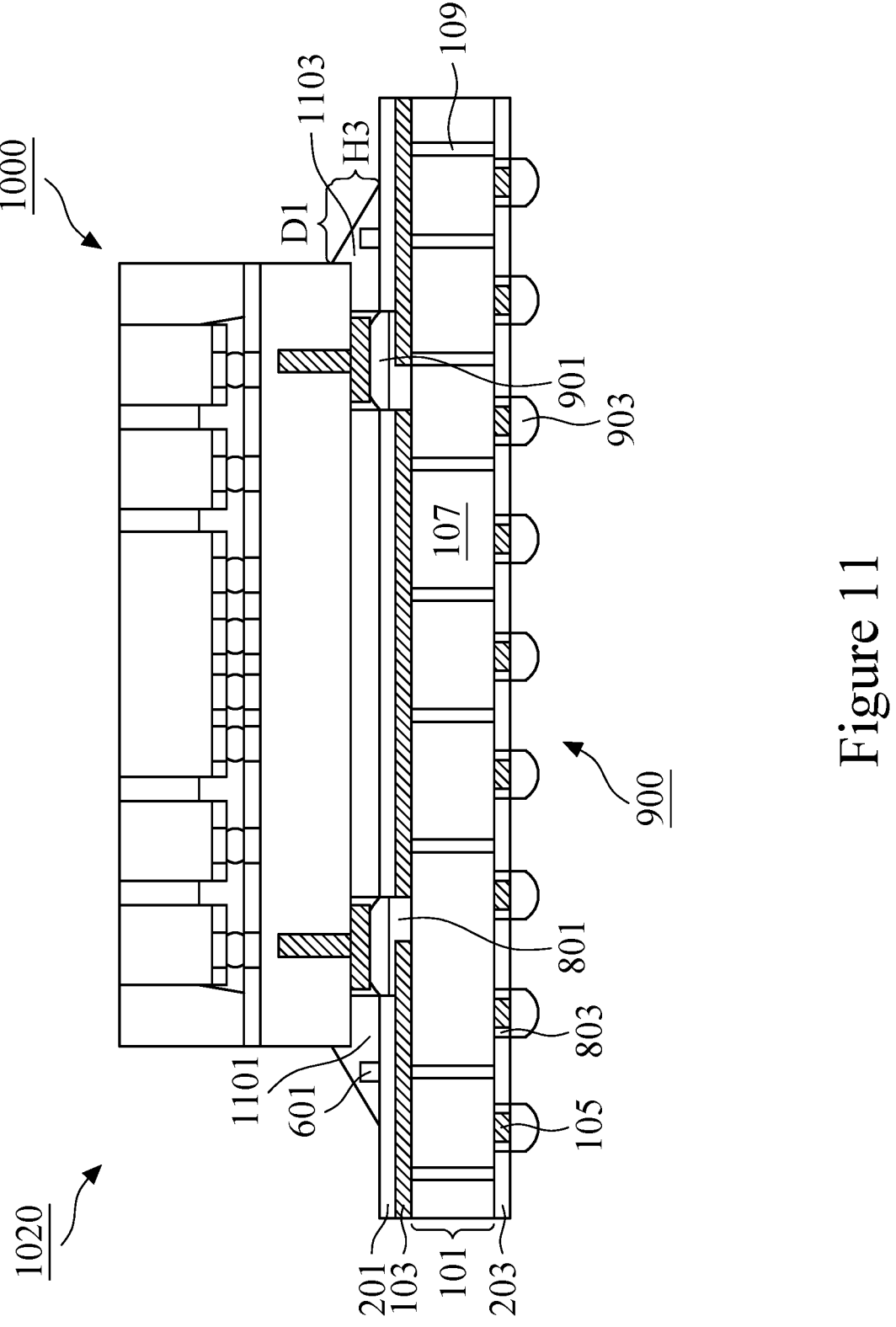

FIG. 11 illustrates the dispensing of a package underfill 1101 between the first package component 1000 and the package substrate 900. The package underfill 1101 may reduce stress and protect the joints resulting from the reflowing of the first external connectors 901. The package underfill 1101 may be formed of an underfill material such as a molding compound, epoxy, or the like. The package underfill 1101 may be formed by a capillary flow process after the first package component 1000 is attached to the package substrate 900, or may be formed by a suitable deposition method before the first package component 1000 is attached to the package substrate 900. The package underfill 1101 may be applied in liquid or semi-liquid form and then subsequently cured. The package underfill 1101 may have an elongation value that ranges from about 2% to about 3%, and a low modulus value that ranges from about 6.5 GPa to about 8 GPa.

The package underfill 1101 is dispensed in such a manner that an underfill fillet 1103 extends from a first point on a side of the first package component 1000 at an angle away from the first package component 1000 towards the upper side of the core substrate 101 until reaching a second point on a surface of the first layer 201. The first point being located a third height H3 away from the surface of the first layer 201, the third height H3 that ranges between about 450 microns and about 650 microns. The second point being located a first distance D1 (i.e. fillet width) away from the side of the first package component 1000, the first distance D1 that ranges between about 1 mm and about 3 mm.

In an embodiment, the underfill fillet 1103 covers the entirety of the first blocks 601. In other embodiments the underfill fillet 1103 covers at least a portion of the first blocks 601, such as covering one sidewall and not fully covering another sidewall. Any suitable amount of coverage of the first blocks 601 is fully intended to be included within the scope of the embodiments.

The first blocks 601 having a higher elongation value than the package underfill 1101 and the first blocks 601 having a different low modulus value than the package underfill 1101. In an embodiment, the first blocks 601 are formed to be located at each corner of the first package component 1000 (or at the corner of a semiconductor die located within the first package component 1000). The presence of the first blocks 601 at each of the corners being covered by the underfill fillet 1103, may help reduce stress in the package underfill 1101 at the corner because of the differences in elongation values and low modulus values between the first blocks 601 and the package underfill 1101.

Figure 12A:
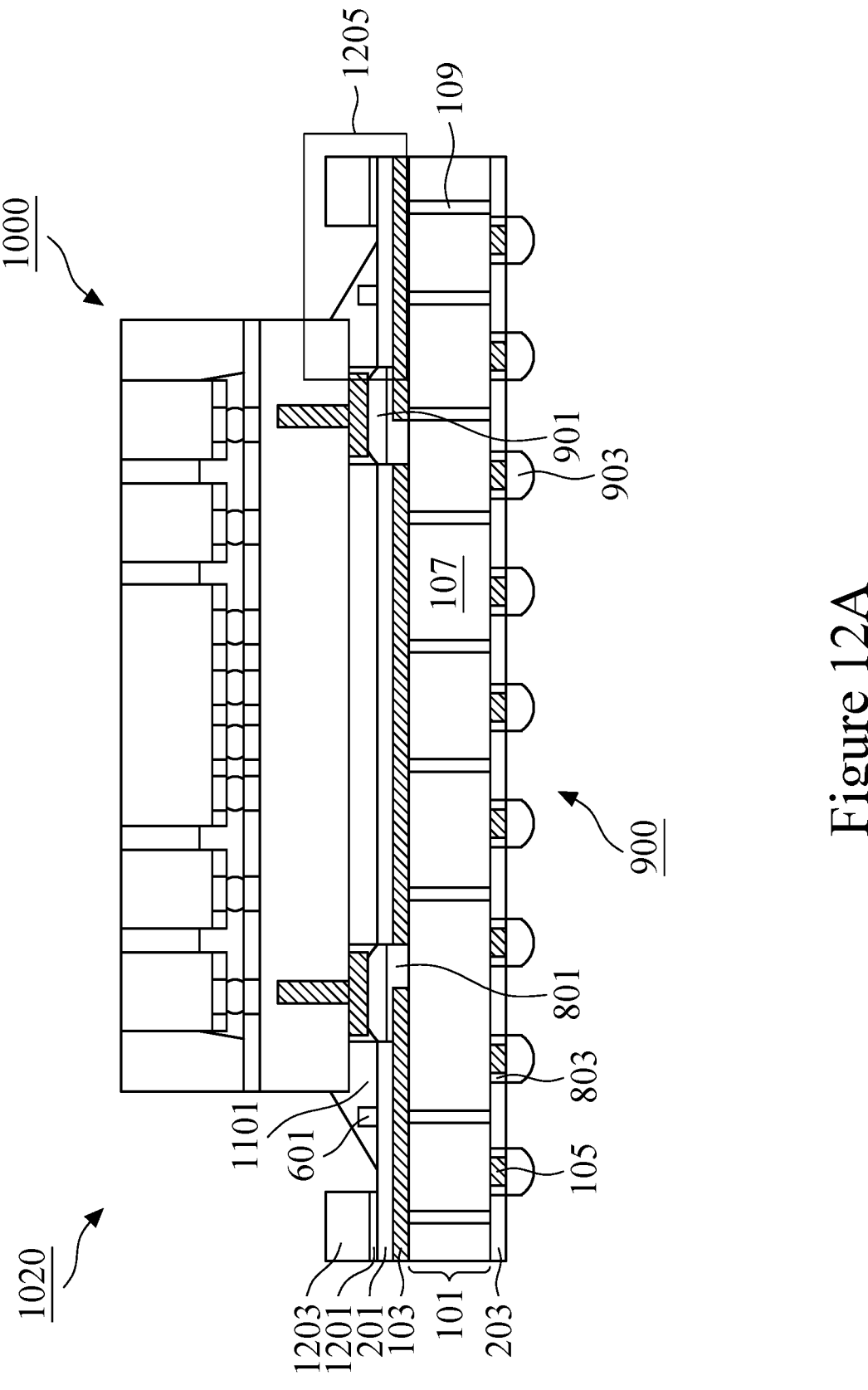

FIG. 12A illustrates a cross-sectional view of the CoWoS 1020 with an adhesive 1201 and a ring 1203. In an embodiment, the adhesive 1201 is dispensed onto the top surface of the first layer 201. The adhesive 1201 may be dispensed in a ring shape encircling the first package component 1000, or may be dispensed as discrete portions aligning to the ring 1203. The thermal conductivity value of the adhesive 1201 may be, for example, lower than about 1 W/mk. In an embodiment the ring 1203 is adhered to the adhesive 1201. The ring 1203 may be a metal ring intended to provide support and stability for the structure and to control warpage in the package substrate 900. Additional structures that are not illustrated, such as lids and/or heat sinks, may also be attached.

FIG. 12A further depicts a detail view section 1205 which is utilized to represent the location of detailed views of various embodiments. These different embodiments represented by detail view section 1205 will be shown in FIGS. 13, and 14 (as taken in cross-section view 'A-A' shown in FIG. 12B). Top-down views of the different orientations of the first blocks 601 at the corner are depicted in FIGS. 15A-15D.

Figure 12B:
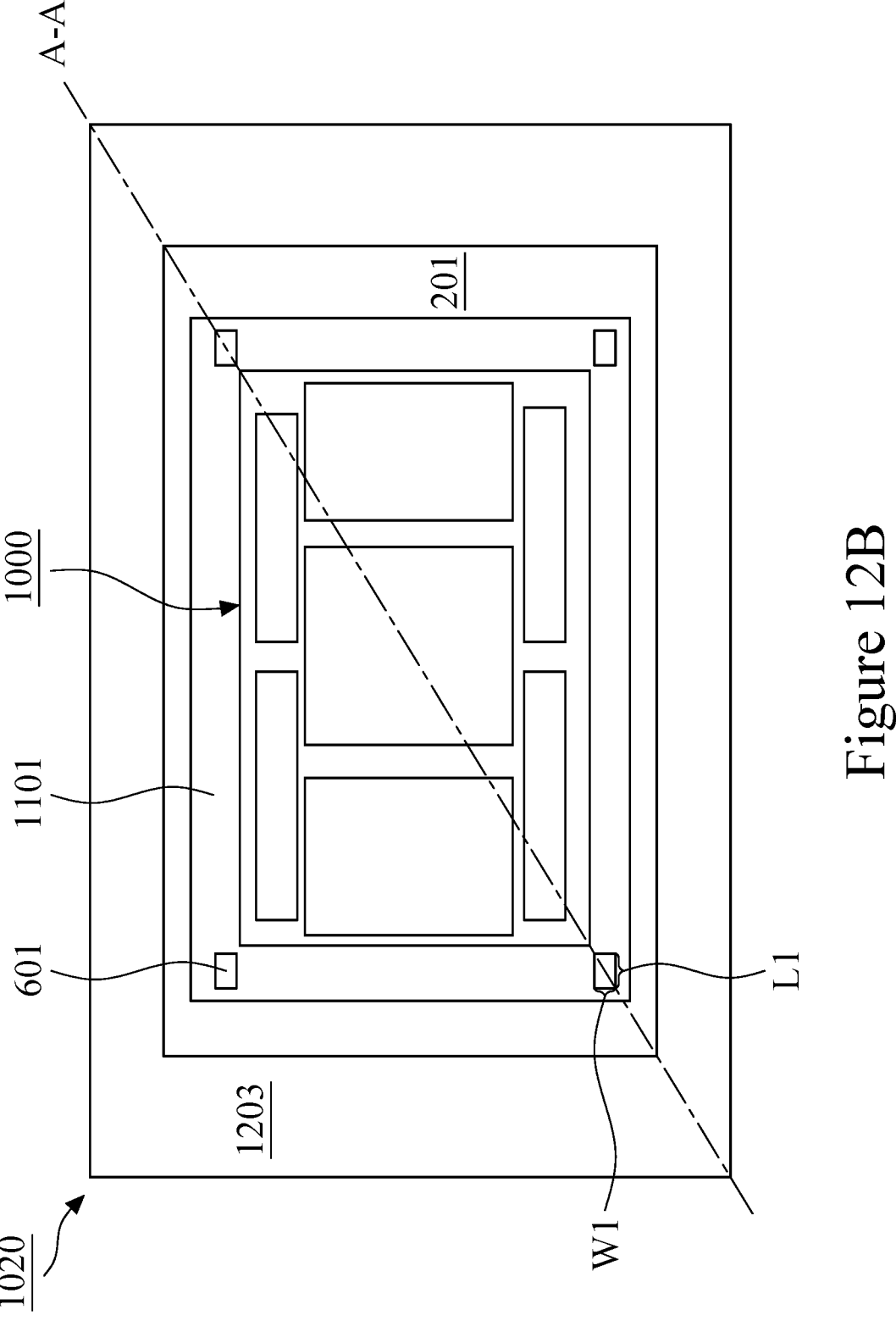

FIG. 12B illustrates a top-down view of the CoWoS 1020 in which various elements are not depicted or are depicted as partially transparent to show the orientation of underlying features in an embodiment. FIG. 12B depicts the ring 1203 fully encircling the first package component 1000. The package underfill 1101 is shown as partially transparent to depict the orientation of the first blocks 601 to the corner, all on the surface of the first layer 201, and is not limited thereto.

Figure 13:
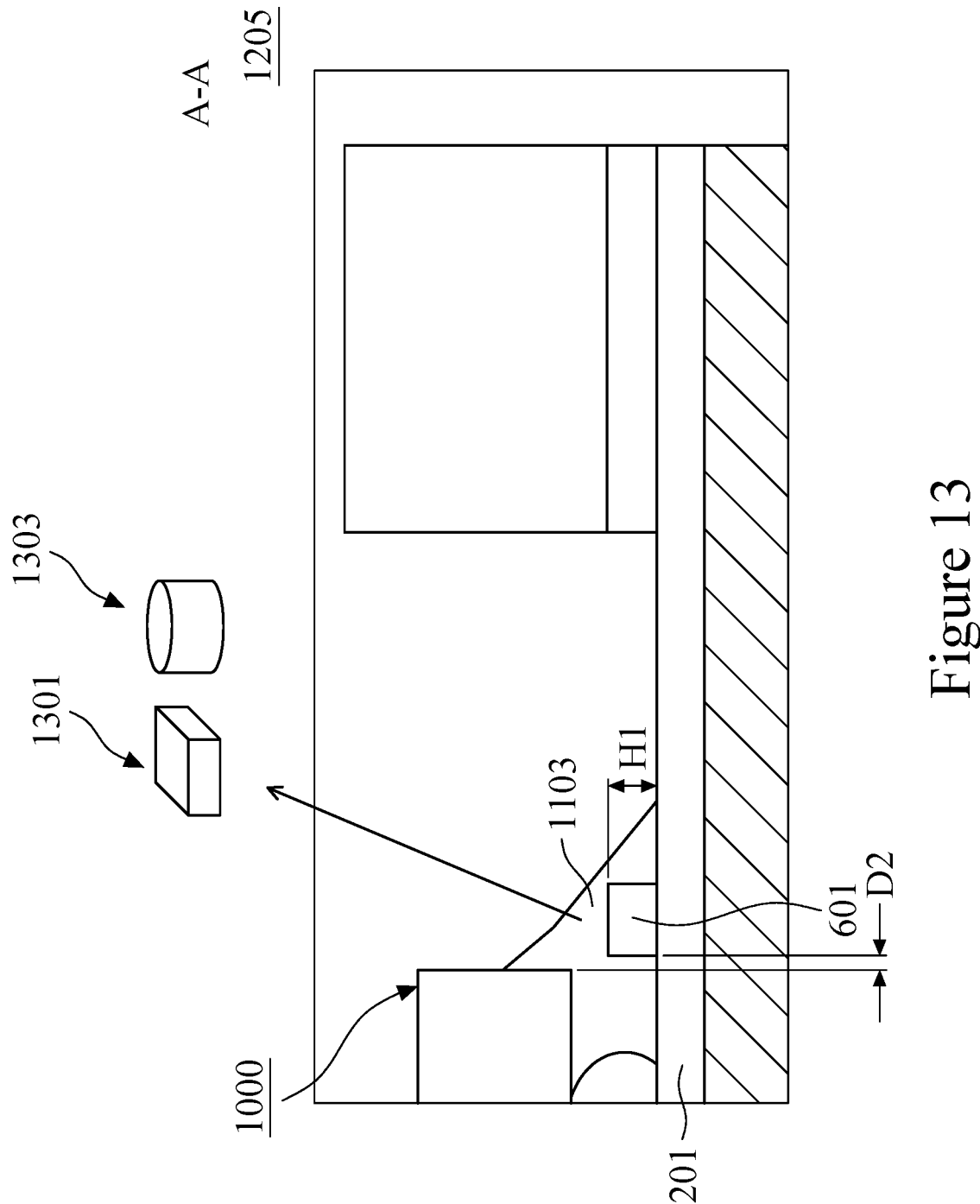
FIGS. 13, 14, and 15A-D illustrate the cross-sectional views and top-down views of various embodiments utilizing the stress-releasing structure contained within the underfill material.

FIG. 13 illustrates the orientation of the first blocks 601 on the surface of the first layer 201. In an embodiment, the first blocks 601 may have the first height H1 away from the surface of the first layer 201. In an embodiment, the first blocks 601 may have a second distance D2 away from the corner of the corresponding die. The second distance D2 that ranges between at least 30 microns and about 100 microns. In an embodiment, the second distance D2 of the first blocks 601 away from the corner of the corresponding die help prevent issues with the dispensing of the package underfill 1101.

FIG. 13 further illustrates the detail view section 1205 in which the first blocks 601 may have various shapes. In an embodiment, the first blocks 601 may be formed to have a rectangular prism shape depicted in FIG. 13 as second blocks 1301. In an embodiment, the first blocks 601 may be formed to have a cylinder shape depicted in FIG. 13 as third blocks 1303. FIG. 13 further illustrates that regardless of the shape of the first blocks 601, the first blocks 601 may remain, but is not required to remain, completely underneath the underfill fillet 1103.

Figure 14:
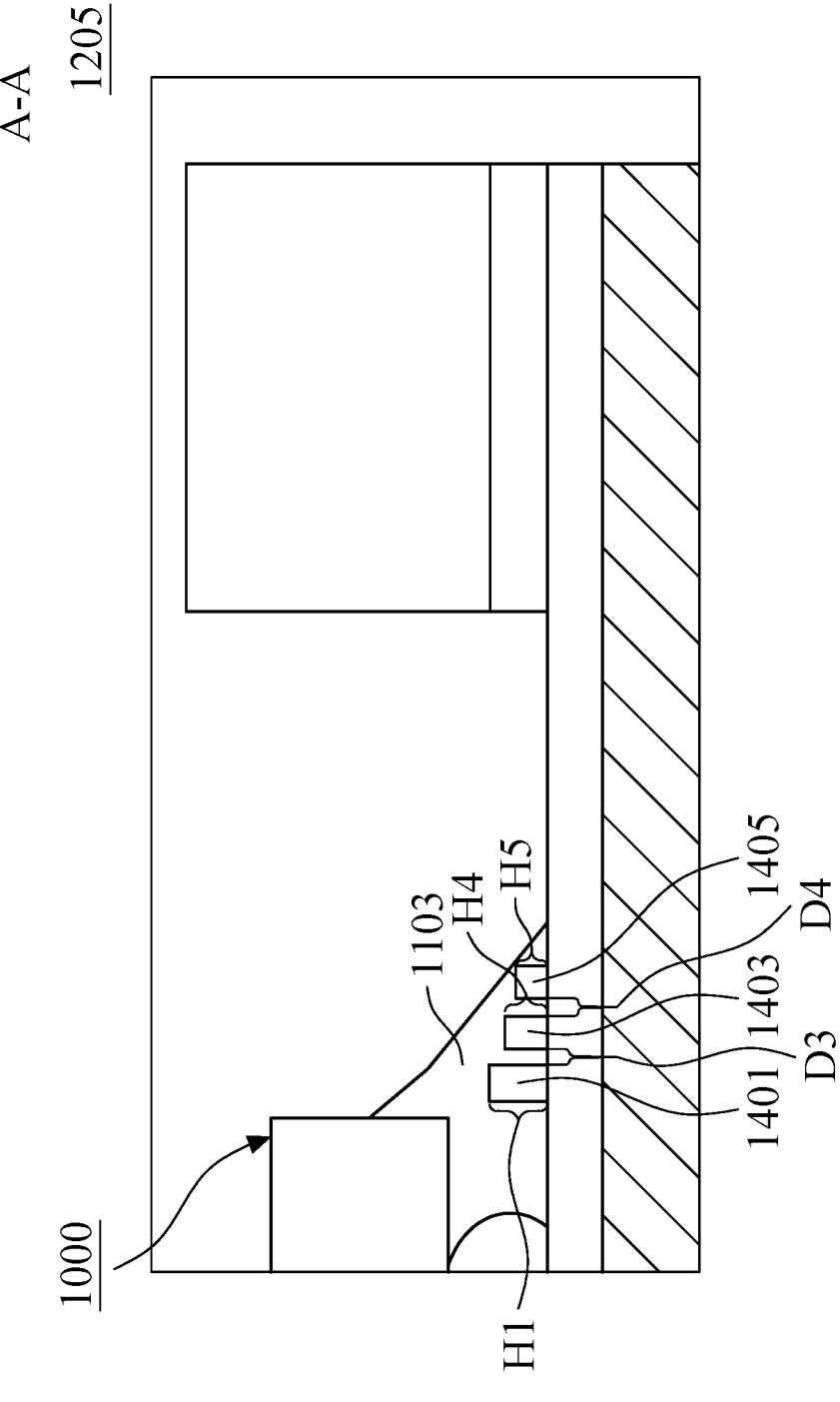

FIG. 14 illustrates another embodiment in which the first blocks 601 may be a multitude of first blocks 601 adjacent the corner depicted in FIG. 14 as fourth blocks 1401, fifth blocks 1403, and sixth blocks 1405. However, the number of first blocks 601 depicted in FIG. 14 is for illustrative purposes only, and any number of first blocks 601 may be present at any of the corners. In an embodiment, the first blocks 601 may be diminishing in size as they are spaced further away from the corner.

For example, the fourth blocks 1401 are the closest to the corner of the corresponding die by a distance of the second distance D2 (as depicted in FIG. 13). The fourth blocks 1401 may have the first width W1 (not depicted in FIG. 14), the first length L1 (not depicted in FIG. 14), and the first height H1.

The fifth blocks 1403 may be slightly further away from the corner of the corresponding die than the fourth blocks 1401 by a third distance D3, the distance that ranges between about 2 microns and about 15 microns. The fifth blocks 1403 may have a second width W2 (not depicted) that ranges between about 10 microns and about 1,000 microns, a second length L2 (not depicted) that ranges between about 10 microns and about 1,000 microns, and a fourth height H4 that ranges between about 10 microns and about 70 microns.

The sixth blocks 1405 may be slightly further away from the corner of the corresponding die than the fifth blocks 1403 by a fourth distance D4, the distance that ranges between about 2 microns and about 15 microns. The sixth blocks 1405 may have a third width W3 (not depicted) that ranges between about 10 microns and about 1,000 microns, a third length L3 (not depicted) that ranges between about 10 microns and about 1,000 microns, and a fifth height H5 that ranges between about 10 microns and about 30 microns. The fourth blocks 1401 being larger than the fifth blocks 1403, the fifth blocks 1403 being larger than the sixth blocks 1405. The variation in size between the first blocks 601 as depicted in FIG. 14 allowing for greater volume of stress release blocks to be present under the underfill fillet 1103 as the underfill fillet 1103 tapers off.

The embodiments discussed above with respect to FIG. 14 are just several examples of embodiments meant to be disclosed herein. In another embodiment, multiple first blocks 601 are located adjacent to the corners that are of the same size and shape. While in another embodiment, the multiple first blocks 601 that are located adjacent to each of the corners are different in shape and size. It should be noted that while three different first blocks 601 are illustrated in FIG. 14 to be located at each of the corners, this is in no way meant to be taken as limiting and any number of first blocks 601 may be oriented at each of the corners. FIG. 14 further illustrates that all of the first blocks 601 may all positioned beneath the underfill fillet 1103, and is not limited thereto.

FIGS. 15A-15D illustrate top-down views of the detail view section 1205 in which various orientations of the first blocks 601 are positioned adjacent to the corner. More volume of the first blocks 601 present at each corner increases the benefit caused by the presence of the first blocks 601 at the corners.

Figures 15A, 15B, 15C, 15D:
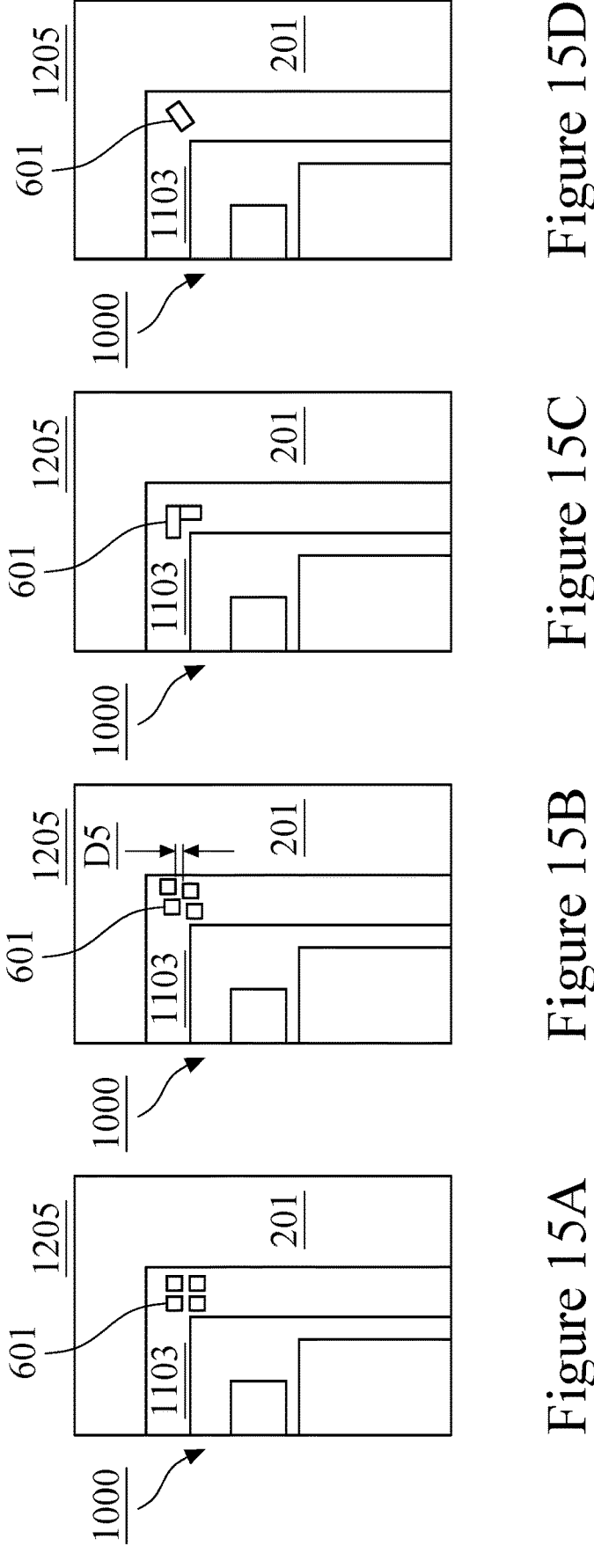

FIG. 15A illustrates an embodiment in which the plurality of first blocks 601 are oriented in an "in-line" pattern. The "in-line" pattern can be rotated 360 degrees along the surface of the first layer 201. In an embodiment the plurality of first blocks 601 in the "in-line" pattern may all be the same size and shape. In an embodiment the plurality of first blocks 601 in the "in-line" pattern may not all be the same size and shape.

FIG. 15B illustrates an embodiment in which the plurality of first blocks 601 are oriented in an "staggered" pattern. The "staggered" pattern can be rotated 360 degrees along the surface of the first layer 201. In an embodiment the plurality of first blocks 601 in the "staggered" pattern may all be the same size and shape. In an embodiment the plurality of first blocks 601 in the "staggered" pattern may not all be the same size and shape. FIG. 15B further illustrates that the plurality of first blocks 601 are separated from each other by a fifth distance, the fifth distance that ranges between at least 5 microns to about 20 microns.

FIG. 15C illustrates an embodiment in which the first block 601 is shaped and oriented in an "U" shape. The "U" shape can be rotated 360 degrees along the surface of the first layer 201.

FIG. 15D illustrates a single first block 601 oriented on an axis extending 45 degrees away from the side of the first package component 1000 on the horizontal plane. In an embodiment the stress-release-block 601 has a center point on the axis upon which the first block 601 can be rotated 360 degrees along the surface of the first layer 201.

Figure 16:
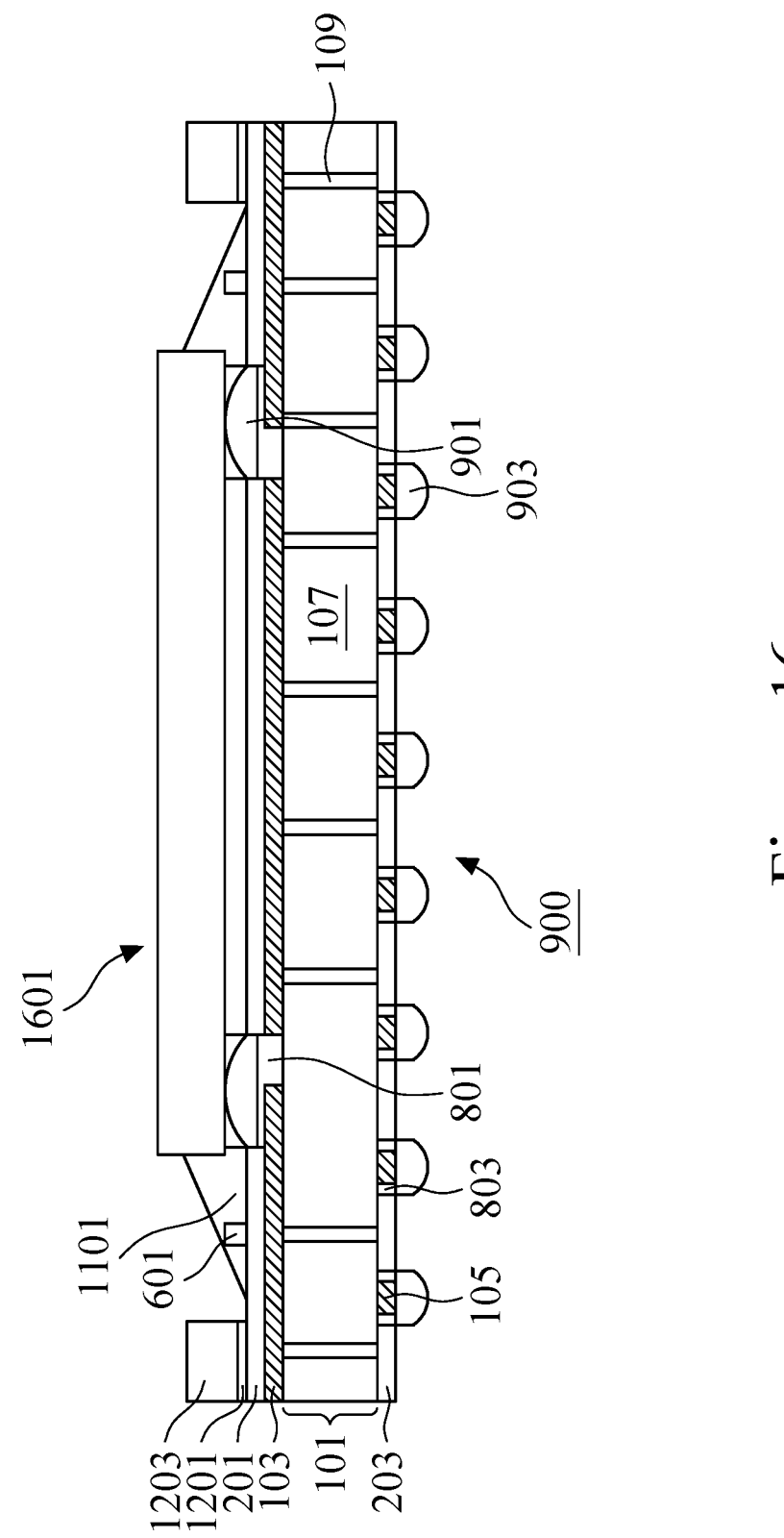
FIG. 16 illustrate the cross-sectional view of a chip mounted onto the large substrate component with the underfill material disposed between and covering the stress-releasing structure built-up on the large substrate component.

FIG. 16 illustrates an embodiment where a chip 1601 is mounted to the package substrate 900 instead of the chip 1601 being mounted to the interposer component 1001 mounted to the package substrate 900. In this embodiment the formation of the package substrate 900 follows in a similar manner as discussed above, as does the placement of the adhesive 1201 and the ring 1203. In this embodiment the chip 1601 has chip connectors (not illustrated) that can be aligned with the first external connectors 901, and the first external connectors 901 can be reflowed to bond the chip 1601 to the package substrate 900 to form a chip-on-substrate (CoS) 1600.

In this embodiment the first blocks 601 may be built up on the package substrate 900 in a similar manner as discussed above, but the first blocks 601 are formed such that the first blocks 601 are located on the surface of the first layer 201 at each corner of the chip 1601. In a similar manner as discussed above the package underfill 1101 is dispensed between the chip 1601 and the package substrate 900 as to cover the first blocks 601. Aspects of embodiments discussed herein are entirely intended to be captured by this embodiment as well.

By adding the first blocks 601 as discussed in the various embodiments presented above advantages can be achieved. The addition of the first blocks 601 helps mitigate the increased impact in the difference in coefficients of thermal expansion between the package substrate 900 and mounted semiconductor packages such as the first package component 1000 or the chip 1601 due to the large sizes of these structures. The mitigation of the difference in coefficients of thermal expansion by the first blocks 601 helps reduce the risk of underfill cracking that can be seen in the package underfill 1101 and can propagate to the first layer 201 resulting in further cracking. Using photolithographic processes to build-up the first blocks 601 helps provide a low cost solution. The advantages of utilizing the first blocks 601 can be seen by an 11% stress reduction at the first package component 1000 or chip 1601 corner.

In accordance with some embodiments of the present disclosure, a method of manufacturing a semiconductor package includes forming a first dielectric layer over a substrate, patterning the first dielectric layer, wherein the patterning the first dielectric layer forms a first protrusion, attaching a semiconductor device to the substrate, wherein the semiconductor device includes at least one semiconductor die, and dispensing an underfill between the semiconductor device and the substrate, wherein the underfill covers and physically contacts the first protrusion. In an embodiment, the at least one semiconductor die has a corner and the first protrusion is located adjacent to the corner. In an embodiment, the first protrusion further includes a plurality of stress-release blocks. In an embodiment, the plurality of stress-release blocks form a staggered pattern. In an embodiment, a closest distance between the first protrusion and the corner is at least 30 microns. In an embodiment, the attaching the semiconductor device utilizes an external connector, the external connector having a first height and the first protrusion having a second height, the first height being twice or greater than the second height. In an embodiment, the first protrusion has an elongation percent of no less than 5% and the underfill has an elongation percent no greater than 2%.

In accordance with some embodiments of the present disclosure, a semiconductor device includes a first polymer layer over a device substrate, a first dielectric block protruding from the first polymer layer, at least one semiconductor chip attached to the device substrate; and, an underfill material between the at least one semiconductor chip and the device substrate, wherein the underfill material encapsulates the first dielectric block. In an embodiment, the first dielectric block is adjacent a corner of the at least one semiconductor chip. In an embodiment, an axis extends away from a side of the at least one semiconductor chip at the corner of the at least one semiconductor chip at a 45 degree angle, the first dielectric block having a centerline that aligns with the axis. In an embodiment, the first dielectric block has a cylinder shape. In an embodiment, the first dielectric block has a thermal decomposition temperature greater than 300° C. In an embodiment, the first dielectric block further includes a plurality of stress-release blocks, the plurality of stress-release blocks forming an "in-line" pattern. In an embodiment, the first dielectric block has a total area on a surface of the first polymer layer, the total area being no less than 100 square microns.

In accordance with some embodiments of the present disclosure, a method of manufacturing a semiconductor device includes forming a redistribution structure over a core substrate, forming a first resist layer over the redistribution structure, patterning the first resist layer to expose a portion of the redistribution structure and a portion of the core substrate, forming a second resist layer over the first resist layer, patterning the second resist layer, wherein the patterning the second resist layer removes the second resist layer from over the portion of the redistribution structure, the portion of the core substrate, and portions of the second resist layer forming a stress-release structure, adhering a chip to the core substrate, and dispensing an underfill covering the stress-release structure. In an embodiment, the patterning the second resist layer is performed by exposing first portions of the second resist layer to an energy source and removing second portions of the second resist layer that was not exposed to the energy source. In an embodiment, the stress-release structure is adjacent to a corner of the chip and further includes a plurality of stress-release-blocks. In an embodiment, the plurality of stress-release-blocks extend away from the corner of the chip in a linear line and a space between each of the plurality of stress-release blocks is at least 5 microns. In an embodiment, the plurality of stress-release-blocks extend away from the corner of the chip, the plurality of stress-release-blocks diminishing in size as the plurality of stress-release-blocks extend further away from the corner of the chip. In an embodiment, the stress-release structure further includes an "L" shaped pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:

forming a redistribution structure over a core substrate;

forming a first resist layer over the redistribution structure;

patterning the first resist layer to expose a portion of the redistribution structure and a portion of the core substrate;

forming a second resist layer over the first resist layer;

patterning the second resist layer, wherein the patterning the second resist layer removes the second resist layer from over the portion of the redistribution structure, the portion of the core substrate, and portions of the second resist layer forming a stress-release structure;

adhering a chip to the core substrate; and dispensing an underfill covering the stress-release structure.

2. The method of claim 1, wherein the patterning the second resist layer is performed by exposing first portions of the second resist layer to an energy source and removing second portions of the second resist layer that were not exposed to the energy source.

3. The method of claim 1, wherein the stress-release structure is adjacent to a corner of the chip and further comprises a plurality of stress-release-blocks.

4. The method of claim 3, wherein the plurality of stress-release-blocks extend away from the corner of the chip in a linear line and a space between each of the plurality of stress-release-blocks is at least 5 microns.

5. The method of claim 3, wherein the plurality of stress-release-blocks extend away from the corner of the chip, the plurality of stress-release-blocks diminishing in size as the plurality of stress-release-blocks extend further away from the corner of the chip.

6. The method of claim 1, wherein the stress-release structure further comprises an "L" shaped pattern.

7. The method of claim 1, wherein the stress-release structure is formed along a diagonal of the chip in a plan view.

8. A method of manufacturing a semiconductor device, the method comprising:

forming a first resist layer over a first substrate, the first substrate having a first conductive feature;

patterning the first resist layer to form a first patterned resist layer, the first patterned resist layer having a first opening exposing a portion of the first conductive feature;

forming a second resist layer over the first patterned resist layer;

patterning the second resist layer to form a second patterned resist layer, wherein the second patterned resist layer comprises one or more stress-release structures on an upper surface of the first patterned resist layer;

attaching a semiconductor structure to the first substrate, a conductive pad of the semiconductor structure being electrically coupled to the first conductive feature; and dispensing an underfill between the semiconductor structure and the first substrate, the underfill covering the one or more stress-release structures.

9. The method of claim 8, wherein the first substrate comprises a core substrate and a first redistribution structure on a first side of the core substrate, the first conductive feature being a conductive feature of the first redistribution structure.

10. The method of claim 8, wherein at least one of the one or more stress-release structures is positioned adjacent to each corner of the semiconductor structure in a plan view.

11. The method of claim 8, wherein a plurality of stress-release structures is positioned in each corner of the semiconductor structure in a plan view.

12. The method of claim 8, wherein the underfill completely covers each of the one or more stress-release structures.

13. The method of claim 8, wherein the one or more stress-release structures are laterally spaced apart from sidewalls of the semiconductor structure.

14. The method of claim 8, wherein the one or more stress-release structures have a thermal decomposition temperature greater than 300° C.

15. The method of claim 8, wherein the one or more stress-release structures comprise a first stress-release structure and a second stress-release structure adjacent a first corner of the semiconductor structure, wherein the first stress-release structure is closer to the semiconductor structure than the second stress-release structure, wherein a height of the first stress-release structure is greater than a height of the second stress-release structure.

16. A method comprising:

forming a first polymer layer over a device substrate;

forming a first dielectric block on an upper surface of the first polymer layer;

attaching a semiconductor structure to the device substrate; and dispensing an underfill material between the semiconductor structure and the device substrate, wherein the underfill material encapsulates an upper surface and all sidewalls of the first dielectric block.

17. The method of claim 16, wherein the device substrate comprises a core substrate and a redistribution structure.

18. The method of claim 16, wherein the first dielectric block is positioned along a line passing through diagonal corners of the semiconductor structure in a plan view.

19. The method of claim 16, wherein the first dielectric block is one dielectric block of a plurality of dielectric blocks, wherein each of the dielectric blocks of the plurality of dielectric blocks is positioned near a respective corner of the semiconductor structure in a plan view.

20. The method of claim 16, wherein forming the first dielectric block comprises forming a plurality of dielectric blocks adjacent a first corner of the semiconductor structure in a plan view, wherein the plurality of dielectric blocks extends away from the first corner of the semiconductor structure, a height of the dielectric blocks of the plurality of dielectric blocks decreases as the plurality of dielectric blocks extend away from the first corner of the semiconductor structure.

* * * * *